(12) United States Patent
Arik et al.

(10) Patent No.: US 8,051,905 B2
(45) Date of Patent: Nov. 8, 2011

(54) COOLING SYSTEMS EMPLOYING FLUIDIC JETS, METHODS FOR THEIR USE AND METHODS FOR COOLING

(75) Inventors: Mehmet Arik, Niskayuna, NY (US); Todd Garrett Wetzel, Niskayuna, NY (US); Stephen Adam Solovitz, Portland, OR (US)

(73) Assignee: General Electric Company, Niskayuna, NY (US)

( * ) Notice: Subject to any disclaimer, the term of this patent is extended or adjusted under 35 U.S.C. 154(b) by 918 days.

(21) Appl. No.: 11/464,563

(22) Filed: Aug. 15, 2006

(65) Prior Publication Data

US 2008/0041574 A1 Feb. 21, 2008

(51) Int. Cl.
- *F28F 13/02* (2006.01)
- *F28F 13/08* (2006.01)
- *F28F 13/10* (2006.01)
- *F28F 13/12* (2006.01)
- *H05K 7/20* (2006.01)

(52) U.S. Cl. ...... 165/287; 165/288; 165/80.3; 165/80.4; 165/109.1; 165/104.33; 165/908; 361/694; 361/699; 417/412; 417/413.1; 417/413.2; 417/413.3; 257/714; 239/4; 239/8; 239/102.1; 239/102.2; 239/434

(58) Field of Classification Search .................. 165/908, 165/104.23, 84, 287, 288, 80.3, 80.4, 109.1, 165/104.33; 239/102.2, 4, 8, 102.1, 434; 417/413.2, 413.3, 413.7, 479, 413.1, 412; 347/68; 92/96; 361/694, 699; 257/714

See application file for complete search history.

(56) References Cited

U.S. PATENT DOCUMENTS

| | | | |
|---|---|---|---|
| 5,758,823 A * | 6/1998 | Glezer et al. | 239/4 |
| 5,894,990 A | 4/1999 | Glezer et al. | |
| 5,988,522 A | 11/1999 | Glezer et al. | |
| 6,056,204 A | 5/2000 | Glezer et al. | |
| 6,123,145 A | 9/2000 | Glezer et al. | |
| 6,210,986 B1 * | 4/2001 | Arnold et al. | 438/42 |
| 6,247,525 B1 | 6/2001 | Smith et al. | |
| 6,253,835 B1 * | 7/2001 | Chu et al. | 165/80.4 |
| 6,301,109 B1 * | 10/2001 | Chu et al. | 361/690 |
| 6,337,794 B1 * | 1/2002 | Agonafer et al. | 361/690 |
| 6,457,654 B1 | 10/2002 | Glezer et al. | |

(Continued)

OTHER PUBLICATIONS

Ari Glezer and Jelena Vukasinovic, Spot-Cooling by Confined, Impinging Synthetic Jet, 2003, ASME.*

*Primary Examiner* — John Ford
(74) *Attorney, Agent, or Firm* — Richard D. Emery

(57) ABSTRACT

In one embodiment, a cooling system is disclosed. The cooling system comprises: a cooling channel for receiving a cooling media, a substrate disposed near the cooling channel, and a fluidic jet disposed within the substrate and in fluid communication with the cooling channel. The cooling channel is for thermal communication with a component to be cooled. The cooling channel has a height of less than or equal to about 3 mm and a width of less than or equal to 2 mm. The fluidic jet comprises a cavity defined by a well and a membrane. In one embodiment, a method of cooling an electrical component comprises: passing a cooling media through a cooling channel, drawing the cooling media into one or more of the fluidic jets, expelling the cooling media from the one or more fluidic jets into the cooling channel, and removing thermal energy from the electrical component.

13 Claims, 5 Drawing Sheets

U.S. PATENT DOCUMENTS

| | | | |
|---|---|---|---|
| 6,494,567 B2 * | 12/2002 | Murai | 347/71 |
| 6,588,497 B1 * | 7/2003 | Glezer et al. | 165/84 |
| 6,606,251 B1 * | 8/2003 | Kenny, Jr. et al. | 361/764 |
| 6,713,942 B2 * | 3/2004 | Raman et al. | 310/316.01 |
| 6,722,581 B2 | 4/2004 | Saddoughi | |
| 6,786,708 B2 * | 9/2004 | Brown et al. | 417/413.3 |
| 7,483,770 B2 * | 1/2009 | Meinders et al. | 700/300 |
| 2003/0075615 A1 * | 4/2003 | Saddoughi | 239/102.2 |
| 2004/0031281 A1 * | 2/2004 | Vaiyapuri et al. | 62/259.2 |
| 2006/0186085 A1 * | 8/2006 | Fuertsch et al. | 216/41 |

* cited by examiner

COOLING SYSTEMS EMPLOYING FLUIDIC JETS, METHODS FOR THEIR USE AND METHODS FOR COOLING

TECHNICAL FIELD

This disclosure generally relates to thermal management of using fluidic jets.

BACKGROUND

In the field of electronic devices there is generally continuous consumer demand for enhanced processing capabilities and size reduction. For example, manufacturers of portable computers (e.g., laptop computers) strive to increase computing functions and reduce size. This is also true in portable electronics, such as personal digital assistants (PDA's), and so forth.

To provide for these demands, electronics manufacturers continue to develop manufacturing method for increasing the density of electrical components that can be disposed on integrated circuits. For example, methods for producing microprocessors have been developed that can produce up to millions of transistors within one square millimeter.

As a result of these innovations in electronics manufacturing technology, thermal management of integrated circuits has developed into an area of great interest. This is due to the fact that integrated circuits can generate an excessive amount of heat, which can hinder their performance and/or cause irreversibly damage. In addition, or alternatively, hot-spots can form within localized areas of the integrated circuit that can cause localized failure. In these specific circumstances, it can be challenging to remove the thermal energy from the portion of the chip that is generating the heat.

Although various methods for integrated circuit cooling have been employed (e.g., cooling fans mounted on microprocessors, heat sinks mounted on microprocessors, and so forth), the technologically advanced integrated circuits being developed necessitate improved cooling systems capable of removing a greater amount of thermal energy per unit area.

BRIEF SUMMARY

Disclosed herein are cooling systems employing fluidic jets, methods for their use and methods for cooling devices.

In one embodiment, a cooling system is disclosed. The cooling system comprises: a cooling channel for receiving a cooling media, a substrate disposed near the cooling channel, and a fluidic jet disposed within the substrate and in fluid communication with the cooling channel. The cooling channel is for thermal communication with a component to be cooled. The cooling channel has a height of less than or equal to about 3 mm and a width of less than or equal to 2 mm. The fluidic jet comprises a cavity defined by a well and a membrane.

In another embodiment, a cooling system comprises: an integrated circuit; a cooling channel for receiving a cooling media, and located in thermal communication with the integrated circuit, a plurality of fluidic jets disposed in a substrate, and an orifice for fluid communication between the cavity and the cooling channel, a lead in operational communication with the membrane, and a controller in operational communication with the lead for activating the fluidic jets.

In one embodiment, a method of cooling an electrical component comprises: passing a cooling media through a cooling channel, drawing the cooling media into one or more of the fluidic jets, expelling the cooling media from the one or more fluidic jets into the cooling channel, and removing thermal energy from the electrical component. The cooling channel is located in thermal communication with an electrical component and in fluid communication with a plurality of fluidic jets, and each fluidic jet comprises a cavity defined by a well and a membrane.

These and other features will be more readily understood from the following detailed description provided in connection with the accompanying drawings.

BRIEF DESCRIPTION OF THE DRAWINGS

Refer now to the figures, which are exemplary embodiments, and wherein the like elements are numbered alike.

DETAILED DESCRIPTION

Disclosed herein are cooling systems comprising fluidic jets, methods for their use and methods for cooling integrated circuits. To be more specific, micro-sized fluidic jets can be positioned in fluid communication with cooling channels that are connected in thermal communication with an electrical component (e.g., an integrated circuit). For example, fluidic jet(s) can be disposed adjacent an area in which a hot spot is likely to occur. Upon activation of the fluidic jet, a cooling media is expelled from the fluidic jet to remove heat from the integrated circuit through the cooling channels. Although the cooling system will be described herein in relation to an integrated circuit for ease of discussion, it is understood that these micro-cooling systems can be employed with various electronic components and other devices.

Figure 1:
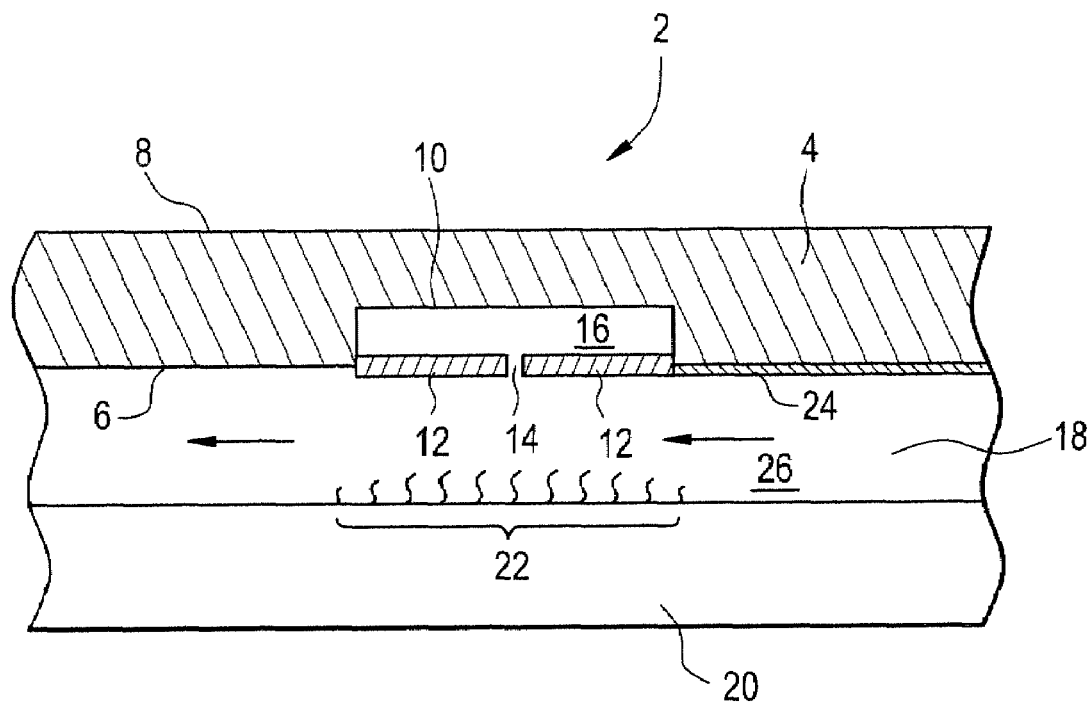
FIG. 1 is a cross-sectional view of an exemplary cooling system.

Referring now to FIG. 1, a cross-sectional view of an exemplary cooling system 2 is illustrated. The cooling system 2 comprises a substrate 4 having an interior surface 6 and an exterior surface 8, wherein a well 10 is formed in the interior surface 6. A membrane 12 is disposed within the well 10, forming a cavity 16 therein. An orifice 14 extends through the membrane 12, fluidly connecting the cavity 16 to a conduit 18. In operation, a cooling media 26 is disposed within the conduit 18, which can optionally flow therethrough as shown by the directional arrows.

Disposed on a side of the conduit 18 that is opposite the interior surface 6 of the substrate 4 is an integrated circuit 20 (hereinafter also referred to as a IC), which dissipates heat 22 into the conduit 18. Disposed on the interior surface 6 is a lead 24, which connects an operable communication with the membrane 12. It is noted that depending upon the configuration of the cooling system 2 and the cooling media employed, the leads 24 (and any connections) can be insulated.

Figure 2:
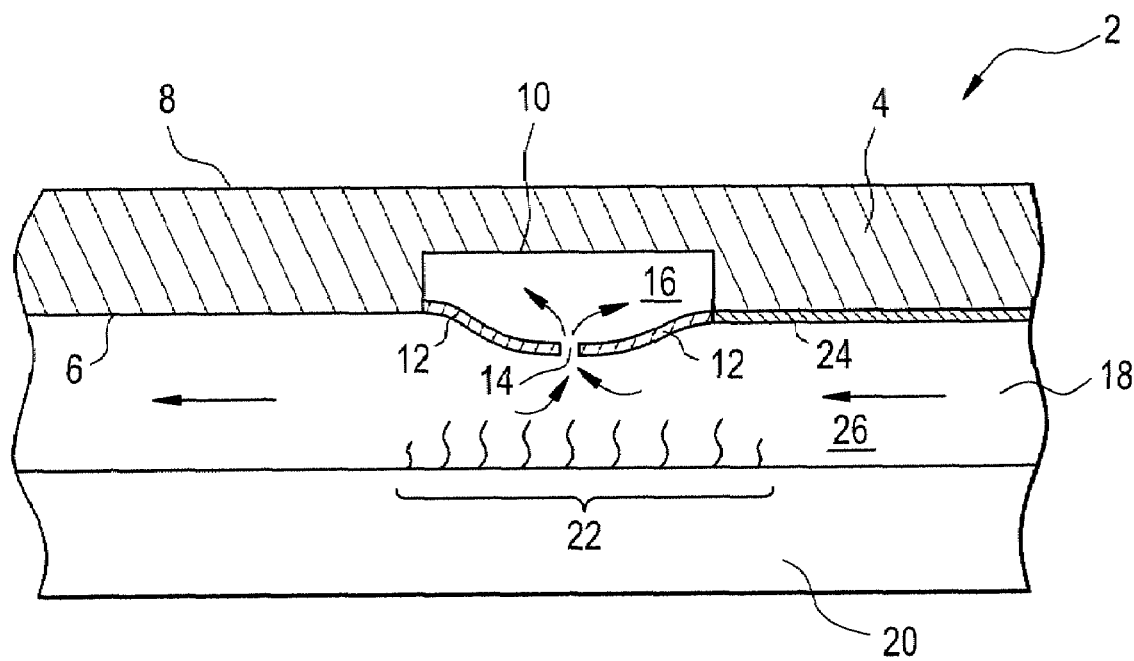
FIG. 2 is a cross-sectional view of an exemplary cooling system illustrating a membrane in a second configuration.
Figure 3:
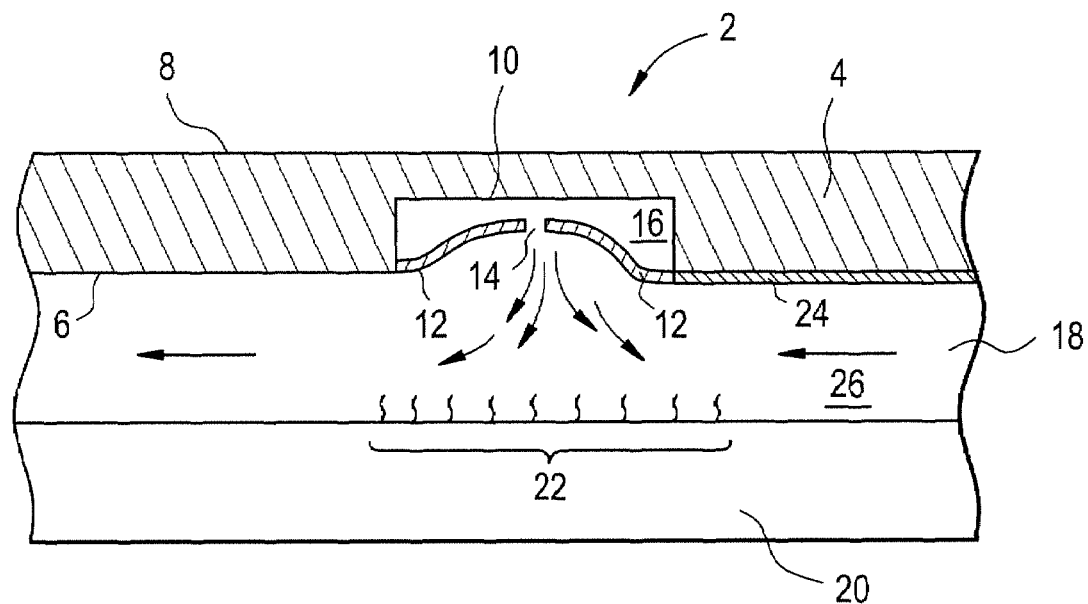
FIG. 3 is a cross-sectional view of an exemplary cooling system illustrating a membrane in a third configuration.

In use, the lead 24 can supply electrical current to the membrane 12. Upon the application of a positive electrical charge, the membrane 12 deforms from the first configuration shown in FIG. 1 to a second configuration, as illustrated in FIG. 2. In FIG. 2, the membrane 12 is illustrated in an exemplary second configuration, wherein the membrane 12 deforms into the conduit 18. Upon deformation, the cavity 16 increases in interior volume, thereby drawing cooling media 26 into the cavity 16, as illustrated by the directional arrows. Upon the application of a negative electrical charge, the membrane 12 deforms into a third configuration, as illustrated in FIG. 3. In FIG. 3, the membrane 12 is illustrated in an exemplary third configuration, wherein the membrane 12 deforms into the cavity 16, effectively reducing the volume of the cavity 16. Upon deformation, the cooling media 26 within the cavity 16 is expelled through the orifice 14 toward IC 20, across conduit 18, and hence providing a fluidic jet that removes heat 22 from the IC 22.

Upon application of an alternating current, such as 100 volts alternating current (A.C.), the membrane 12 will oscillate between the second configuration shown in FIG. 2 and the third configuration illustrated in FIG. 3 to provide a pulsating jet of cooling media 26 that aids in removing heat 22 from the IC 20.

The fluidic jet can reduce the temperature of the substrate by either increasing the turbulence (e.g., effectively increasing the Reynold's number (Re)) of the cooling media 26 and/or by atomizing the cooling media 26 as it is expelled from the orifice 14. The rate at which the cooling media 26 is expelled from the fluidic jet is dependent upon the viscosity of the cooling media 26, the dimensions and number of orifice(s) 14, the size of the membrane 12, the volumetric change in the cavity 16, as well as other variables. However, rates of up to about 90 meters per second have been exhibited.

Figure 4:
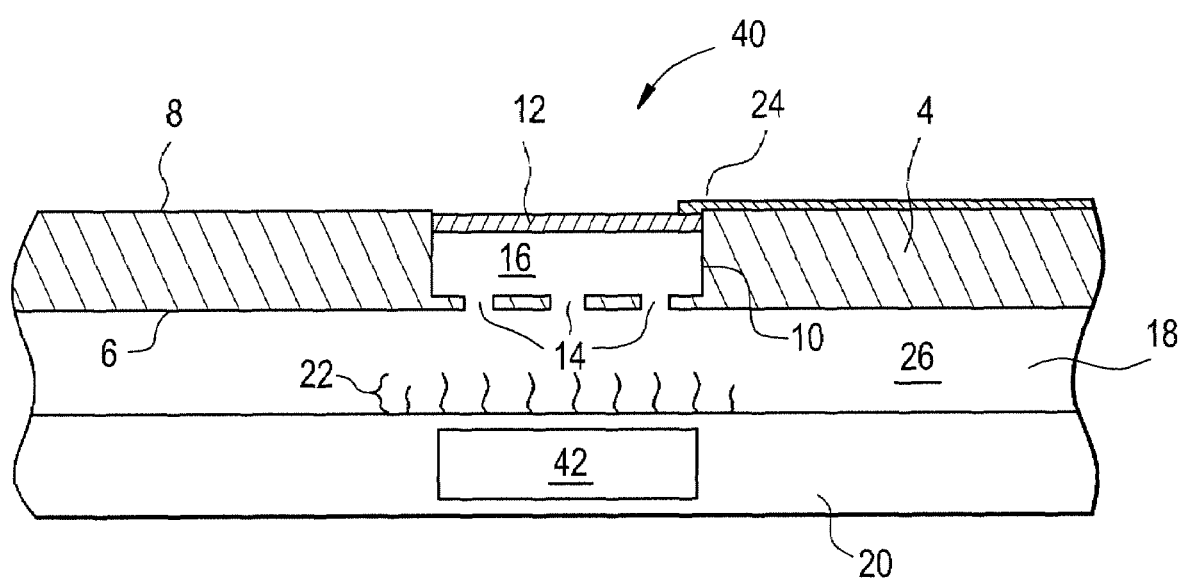
FIG. 4 is an exemplary illustration of an alternative cooling system.

The fluidic jet can comprise any configuration, however it generally comprises a membrane 12 that is connected in operational communication to a cavity 16, and an orifice 14. For example, referring now to FIG. 4, an alternative cooling system 40 is illustrated. In FIG. 4, the fluidic jet has been formed by disposing a well 10 in the exterior surface 8 of the substrate 4, wherein the well 10 comprises multiple (e.g., two, three, or more) orifices 14. Disposed within the well 10 is a membrane 12, which forms a cavity 16 therebetween. The membrane 12 is connected in electrical communication to a lead 24.

The cavity 16 has a size sufficient to receive and expel a sufficient volume of cooling media to cool the desired area of the IC. The specific dimensions of the cavity 16 are dependent upon the size of the substrate, location of the membrane in the well 10, and the particular cooling system design. For example, the fluid jet can be used to cool a single point (e.g., a portion of a single cavity), or can be used to cool portions of multiple cavities (e.g., the orifice can extend across more than one channel (or portions or more than one channel) so that it can expel cooling media into more than one channel). Where the orifice spans more than one channel, the cavity can provide fluid communication between the channels that are in fluid communication with that orifice (e.g., even when the channels are not otherwise in fluid communication).

In some embodiments the cavity can have a depth that is about 10 μm to about 3 mm, or, more specifically, about 200 μm to about 700 μm. The cavity opening can be a size that is substantially similar to the membrane size down to a size that is 20% less than the membrane size, or, more specifically, the cavity opening can have a size of about 90% to about 100% of the membrane size (length and width).

The cavity 16 is connected in fluid communication with a conduit 18, wherein a cooling media is disposed. The conduit 18 is bound on the opposite side of the substrate 4 by an IC 20, wherein an electrical component 42 is disposed. The electrical component radiates heat 22 into the conduit 18.

Upon electrical excitation of the membrane 12 (provided by the lead 24), the membrane 12 can deform, either to increase the volume of the cavity 16 or reduce the volume of the cavity 16. Accordingly, when the volume of the cavity 16 is reduced the cooling media 26 is directed through the orifices 14 to remove all or a portion of the heat 22 generated by the electrical component 42.

The membrane 12 can comprise materials that are capable of deforming upon the application of electrical current to form a fluidic jet. One non-limiting example of an applicable material is lead zirconia titanate (PZT) ceramic in doped or undoped form. Dopants utilized can comprise acceptor dopants that create anion vacancies and donor dopants that create cation vacancies. Cation doped PZT is especially useful as it can enable increased piezoelectric motion compared to undoped and/or acceptor doped PZT.

The membrane 12 can be formed into many shapes, however membranes having a circular disk-like shape exhibit particular utility as the deflection of a disk shaped membrane reduces stress concentrations, which improves membrane 12 service life. In addition, disk-shaped membranes provide excellent volumetric deflection for their size compared to non-circular shapes (e.g., a square-shaped membrane 12).

The membrane 12 can be manufactured utilizing a microfabrication technique, using silicon nitride for example. In such a technique, a well is created via an etching process and filled with a sacrificial layer, such as polyimide. Then a nitride layer is deposited on the top of the filled well, followed by the deposition of a piezoelectric layer. The device is then exposed to a microlithography process, and an orifice is etched through the PZT and nitride films utilizing a dry etching method. The polyimide is then etched using a wet etching process.

The specific dimensions of the membrane are based upon the desired deflection, fluidic jet volume, and other variables. Generally, however, PZT membranes comprise a thickness that is greater than or equal to about 2 micrometers (μm). The membrane thickness can be about 2 μm to about 2 millimeters (mm), or, more specifically, about 50 μm to about 2 millimeters (mm). The width of the membrane is based upon the size of the well, wherein the membrane has a width that is similar to the width of the well. The membrane can have a width (as measured along a major axis) of about 2 mm to about 50 mm, or, more specifically, about 10 mm to about 40 mm. In one embodiment (known as meso or mini scale devices), the membrane 12 can have a thickness of about 1 mm and a diameter (as measured along a major axis) of about 1.5 inches (about 38 mm). However it is to be understood that the specific dimensions of the membrane 12 can be altered based on well design, application requirements, membrane material, supply voltage considerations, desired cooling, and so forth, as well as combinations comprising at least one of the foregoing considerations.

The orifice 14 can be disposed in any configuration enabling fluid communication between the cavity 16 and the cooling media 26. If extending through the membrane 12, the orifice 14 can be disposed in any location, such as at the center of the membrane 12 or off-center (e.g., along an edge or corner). If extending through a portion of the substrate 4, the orifice 14 can be disposed in any location that connects the cavity 16 to the cooling media 26. Further, the orifice 14 can comprise any shape (e.g., cylindrical, conical, and so forth) comprising any cross-sectional shape (e.g., circular, polygonal, complex shape, and so forth), however a cylindrical shape having a circular cross-section can provide the greatest ease of manufacturability. In addition to the shape, the orifice angle can be chosen to attain the desired fluid effect (e.g., atomization), and or fluid introduction direction, and so forth.

The size of the orifice is dependent upon the size of the membrane and/or cavity (depending upon whether the orifice is disposed through the membrane or the substrate), the number of orifices, and the desired area to be cooled with that particular fluid jet (e.g., a portion of a single channel, or portions of more than one channel) as well as the desired flow characteristics through the orifice, including volumetric flow rate. When the orifice(s) are disposed through the substrate (e.g., similar to FIGS. 4 and 5), the orifice can have an opening size that is less than or equal to about 95% of the cavity opening size, or, more specifically, less than or equal to about 50% of the cavity opening size, or, even more specifically, less than or equal to about 40% of the cavity opening size. When the orifice(s) are disposed through the membrane (e.g., as in FIGS. 1-3), the orifice can have an opening size that is less than or equal to about 50% of the membrane size (length and width), or, more specifically, less than or equal to about 25% of the membrane size, or, even more specifically, about 8% to about 15% of the membrane size.

The substrate 4 can be a formed from any material that comprises sufficient stiffness to support the membrane 12 during operation (e.g., oscillation). Exemplary materials can comprise semiconductors (e.g., germanium, silicon, gallium arsenide, indium phosphide, and mercury cadmium telluride), polymeric materials (e.g., thermosets (epoxy) or thermoplastics (polysulfone, polyetherimide and so forth)), metals (e.g., copper, titanium, iron, nickel, and aluminum), metal alloys (e.g., nickel-cobalt alloys, boron-nitride, silicon-carbide, as well as martensitic, ferritic, and austenitic materials), ceramics (e.g., silicon oxides, aluminum oxides, zirconium oxides, silicon carbide, sodium carbide, zinc oxide, and so forth), as well as combinations comprising at least one of the foregoing materials. The well 10 can be formed therein by materials removal processes, such as milling, grinding, drilling, boring, etching, eroding, and so forth. The well 10 can also be formed as the substrate 10 is formed, such as utilizing casting, molding, deposition, or other forming processes.

The substrate 4 can comprise any thickness that is sufficient to comprise a well 10 having dimensions that are sufficient to provide a desired amount of volumetric displacement of the membrane 12 and retain a desired amount of structural integrity. In addition, the substrate provides impact resistance and resistance to stress cracking due to thermal distortion. In one embodiment, a substrate 4 can be produced to have an overall thickness of about 0.150 inches (3.8 mm) and comprise a plurality of wells 10 having a depth of about 0.075 inches (1.9 mm).

The cooling media 26 can comprise any liquid and/or gas that can remove heat 22 from the IC 20 and/or electrical component 42. Further, it is desirable that the cooling media 26 has a high thermal capacity, such that the cooling media 26 is capable of absorbing a desirable amount of heat with respect to the resulting change in the cooling media's temperature. Exemplary materials include air, nitrogen, water, ethylene glycol, alcohols, and so forth. The specific cooling media 26 chosen will also comprise a viscosity that allows it to effectively be drawn into the cavity 16 and displaced therefrom upon movement of the membrane 12. For example, in a cooling system wherein the orifice 14 comprises a 0.02 inch (0.051 cm) diameter hole, water (having a viscosity of about $0.65 \times 10^{-3}$ Pa-s (Pascal-seconds)) at 40° C.) can be more suitable than ethylene glycol solutions (having a viscosity of about $12.0 \times 10^{-3}$ Pa-s at 40° C.) as the resistance of the ethylene glycol can hinder effective transport through the orifice 14.

The cooling media can be part of a close loop or open loop system. In the closed loop system, the cooling media is part of the cooling system such that the fluid remains in the system and does not flow out of the system during system use. In some embodiments, adjacent channels can be in fluid communication such that the cooling media flows in series from one channel to and through an adjacent channel. In other embodiments, the cooling media can flow through channels that are not in fluid communication such that a parallel fluid flow is established where the fluid flows through one channel and not through other channels. In some embodiments, the fluid communication is established through the cavity(ies).

The cooling systems can be used to cool any type of integrated circuit 20 and/or electronic component(s) 42. Namely, the integrated circuit 20 and/or electronic component(s) 42 can comprise any electrical circuit or electronic component (e.g., transistor, resistor, capacitor, and so forth). In the specific embodiments illustrated in FIGS. 1, 2 and 3, it is envisioned that IC 20 is central processing unit. In FIG. 4, the electronic component is envisioned as a portion, or section, of a central processing unit that is susceptible to damage from heat, such as that which could be generated by over-clocking the device (e.g., increasing the speed of processing functions such that excessive heat is generated without cooling the IC 20).

Figure 5:
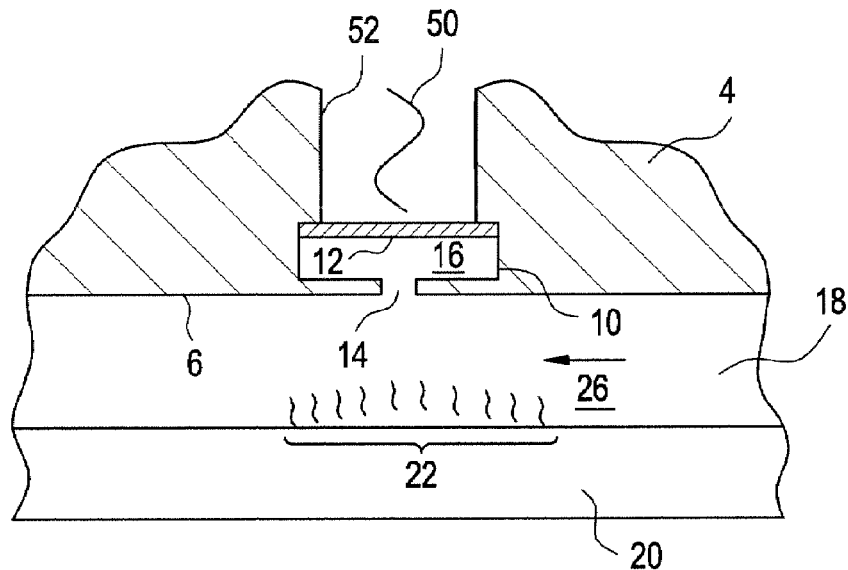
FIG. 5 is an exemplary illustration of an alternative fluidic jet.

Referring now to FIG. 5, an alternative fluidic jet is illustrated, wherein an oscillating wave 50 passing through a channel 52 in the substrate 4 causes membrane 12 to vibrate. As a result of the vibration, the cavity 16 formed between the membrane 12 and the well 10 changes in volume, causing the cooling media 26 to be drawn into, and expelled from, the cavity 16 through orifice 14.

The oscillating wave 50 can be produced using various wave generators that are capable of generating motion of the membrane 12. For example, a sound generator can produce acoustic waves (e.g., a magnetic loudspeaker, a piezoelectric film, ultrasonic, electrostatic, and so forth) sufficient for oscillating the membrane 12.

In another embodiment, a pressure oscillating apparatus can be employed to vary the pressure within the channel 52 and/or well 10 to cause the membrane 12 to oscillate. For example, the pressure of the channel 52 can be oscillated utilizing a piston configured to translate within the channel 52. To be more specific, a rotating crankshaft can be connected to the piston via a piston rod. Upon rotating the crankshaft, the piston translates in a direction that is away from the membrane 12 to generate a negative pressure within the channel 52, which causes the membrane 12 to deform in a manner that increases the volume of the cavity 16, thereby drawing coolant into the cavity 16. Upon further rotation of the crankshaft, the piston translates in a direction that is towards the membrane 12 to generate a positive pressure within the channel 52 causing the membrane 12 to deform in a manner that decreases the volume of the cavity 16 and expels the cooling media 26 out of the orifice 14.

In another embodiment, the membrane 12 can be oscillated using a mechanical apparatus, which acts on the membrane to cause it to deform, thereby varying the volume of the cavity 16 and creating a fluidic jet. For example, a rotating cam can be employed to act directly upon the membrane 12 to cause an oscillation in the volume of the cavity 16 that generates a fluidic jet through the orifice 14. In other examples, arms, pistons, levers, and so forth can be employed to cause distension of the membrane 12.

Figure 6:
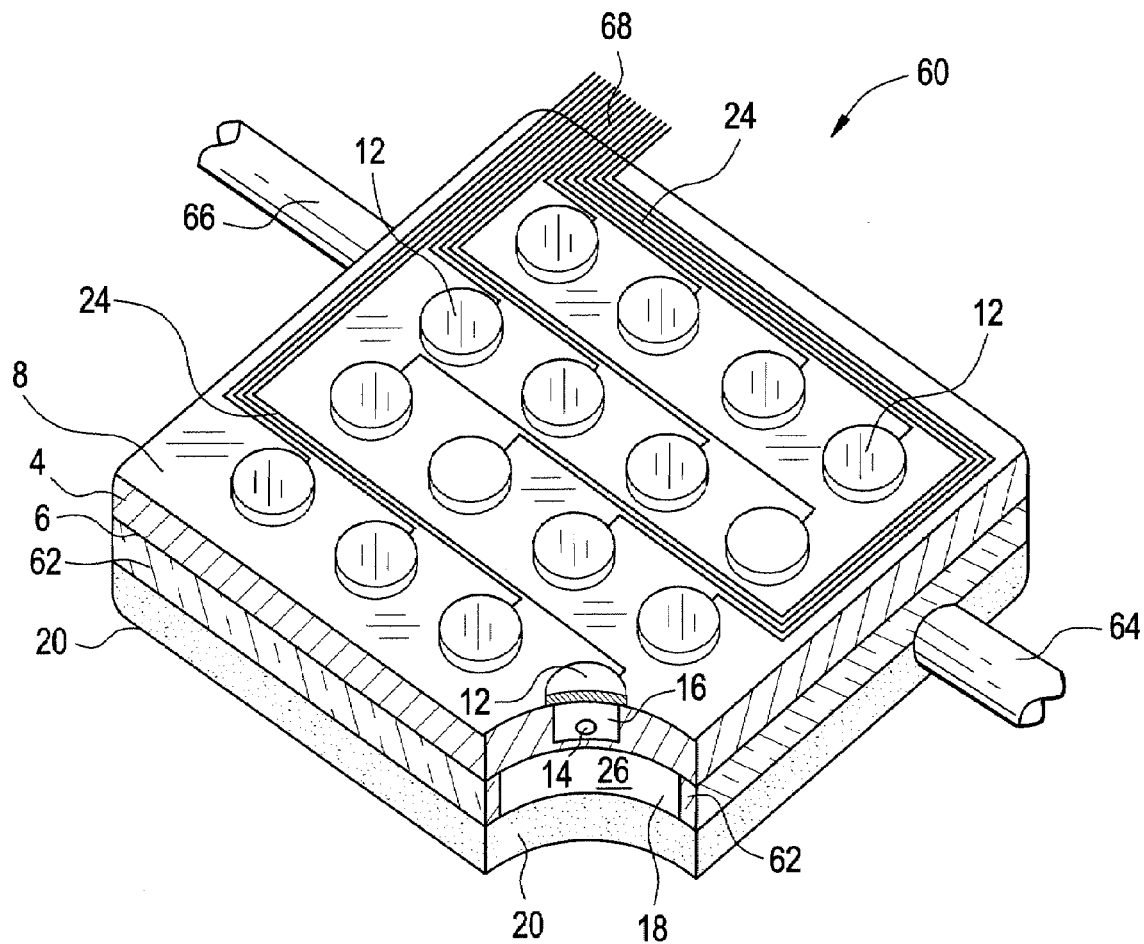
FIG. 6 is an oblique and partially cross-sectioned view of an exemplary cooling system.

Referring now to FIG. 6, an oblique and partially cross-sectioned view of an exemplary cooling system 60 is illustrated. The cooling system comprises a substrate 4 having sixteen membranes 12 disposed on its exterior surface 8. The substrate 4 comprises sixteen cavities 16 that are positioned under the membranes 12 shown. The cavities 16 are connected in fluid communication to a conduit 18 via an orifice 14, thereby forming fluidic jets.

The sixteen fluidic jets are employed to cool an IC 20. To do so, a cooling media 26 flows through an inlet tube 64 and into a conduit 18 disposed between the substrate 4 and the IC 20. The conduit 18 is sealed on all sides by walls 62, which prevent the cooling media 26 from leaking therefrom. Each fluidic jet draws in a portion of the cooling media 26 upon the outward distension of its membrane 12 (see the second configuration illustrated in FIG. 2) and expels the portion of cooling media 26 with the inward distension of the membrane 12 (see the third configuration illustrated in FIG. 3). When the cooling media is expelled, it is directed at the IC 20, which increases the cooling media's ability to absorb heat. Once the cooling media 26 has absorbed heat from the IC 20, it exits the cooling system 60 via an outlet tube 66.

In the present embodiment, the IC 20 can comprise a size of about 2.0 inches (51 mm) in length by about 2.0 inches (51 mm) in width by about 0.2 inches (5 mm) in thickness, wherein each of the sixteen fluidic jets comprise membranes measuring about 0.35 inches (8.9 mm) in diameter having a thickness of about 0.010 inches (0.25 mm). The cavities can have a width of about 8.9 mm and a height of about 1.7 mm, with an orifice diameter of about 500 µm (e.g., as measured along a major axis). The channel size can be about 1 mm wide and about 1 mm deep, with an about 20 µm to about 500 µm spacing between the channels. The membranes 12 are connected in electrical communication to leads 24, which optionally can join to form a connection 68.

Although the IC 18 is illustrated as one volume in the present embodiment, it is to be apparent that any of the embodiments discussed can comprise multiple conduits. For example, the present embodiment can be configured such that the inlet tube 64 fluidly connects to a manifold (disposed within, or outside, the cooling system 60) that connects to four conduits 18 disposed between the substrate 4 and the IC 20, wherein four of the fluidic jets are disposed in operational communication with each of the four conduits 18.

Each membrane 12 is connected to a distinct lead 24 to enable each fluidic jet to be individually operable. For example, in one embodiment, a portion of the membranes can be activated if the temperature of the IC 20 is not determined to be excessive by a sensor disposed in operational communication with the IC 20. If it is determined that the temperature of the IC 20 is unacceptable, all of the fluidic jets can be activated to quickly reduce the heat of the IC 20. To enable this operation, a temperature controller can be employed, such as an on/off controller, proportional-integral-derivative controller, closed loop controller, and so forth, that is operably connected to sensors (e.g., nickel-chromium (chromel), nickel aluminum (alumel), iron-constantan temperature sensors) disposed in operational communication with the IC 20, the cooling media 26 (such as within the outlet tube 66), and/or in any other configurations that enable the temperature of the IC to be controlled.

In one exemplary method of operating the cooling system, first the controller monitors the temperature of the IC 20. As discussed, this can be provided by communication of the controller with a sensor. Next, as the temperature is being monitored, the controller can determine if the temperature is above an acceptable limit. If not, the controller will continue to monitor the temperature. If the temperature is above the acceptable limit, the controller can activate the fluidic jets. Or, in another embodiment, the controller can determine which fluidic jets (e.g., a fluidic jet, a portion of the fluidic jets, or all of the fluidic jets) to activate.

For example, in one embodiment a cooling system 60 comprises a temperature controller that is connected in operational communication to a grid of temperature measurement devices (e.g., thermocouples, thermisters, resistors, diodes, and so forth) disposed on the surface of the IC 20. During operation, the controller (e.g., a computer, controller, or so forth) monitors the temperature of the IC 20 in one or more locations. If any of the temperatures are determined to be greater than an acceptable limit, the controller determines which fluidic jets to activate to reduce the temperature of the IC 20 in the area that is above the acceptable limit. In this embodiment, the grid can be formed on the surface of the IC, e.g., utilizing a photolithography process. Further, a connection 68 can be connected to the grid and disposed on an external surface of the cooling system 60 to enable ease of connection of the grid to the controller.

In the embodiment illustrated in FIG. 6, the fluidic jets can be capable of increasing the turbulence of the cooling media 26 flowing under the jet and/or within the conduit 18. Alternatively, or in addition, the fluidic jets can impinge the flow of the cooling media 26 under the jet to increase volumetric flow rate across the surface of the IC to remove an increased amount of thermal energy compared to systems that do not employ fluidic jets. In another embodiment, the conduit 18 can be modified to yet further improve heat removal, such as by modifying the number of conduits, the dimensions of the conduits 18, adding a manifold (not shown) to the outside, or within, the cooling system 60 that provides even flow across the entire IC 20 area (e.g., reducing and/or eliminating areas of stagnant or poor flow, such as corners), and so forth.

Figure 7:
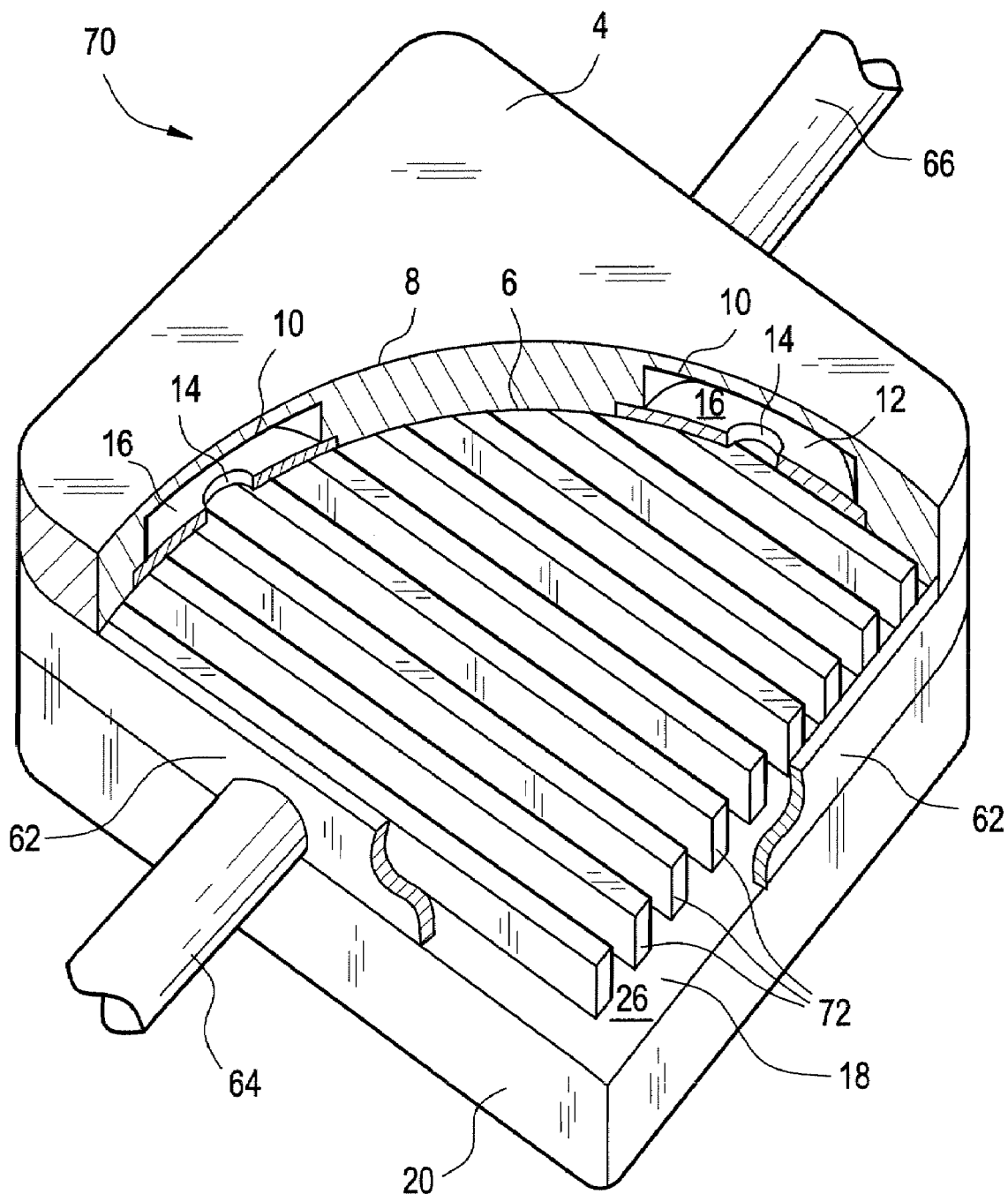
FIG. 7 is a partially cross-sectioned view of an exemplary cooling system.

Referring now to FIG. 7, a partially cross-sectioned view of an exemplary cooling system 70 is illustrated, which comprises cooling channels 72. The cooling channels 72 are connected in thermal communication to the IC 20 and extend into the conduit 18. Cooling media 26 flows into the conduit 18 (e.g., the space between the substrate 4 and the IC 20) through inlet tube 64, flows over, through, and/or around the cooling channels 72 and absorbs thermal energy from the IC 20. The heated cooling media 26 exits the conduit 18 through the outlet tube 66. The cooling system 70 comprises four fluidic jets, two of which are shown in cross-section. The fluidic jets comprise membranes 12 that are disposed in wells 10 forming a cavity 16 therein. An orifice 14 enables fluid communication between the cavity 16 and the conduit 18.

In use, the cooling channels 72 assist to dissipate heat from the IC 20 by increasing the effective area that is in contact with the cooling media 26 that is disposed within the conduit 18. Further, the cooling channels 72 can increase the turbulence of the cooling media 28, thereby increasing the ability of the cooling media 26 to absorb heat. Yet further, an electrical source (not shown) can be connected to the fluidic jets (e.g., the membrane 12) causing the membrane 12 to oscillate and expel a jet of cooling liquid 26, thereby further increasing the cooling ability of the cooling system 70.

In the present embodiment, the IC 20 comprises a size of about 20 mm in length by about 20 mm in width by about 5 mm in thickness, wherein each of the fluidic jets comprise membranes measuring about 160 µm in diameter having a thickness of about 5 µm. The cavities can have a width of about 100 µm and a height of 300 µm, with an orifice diameter of about 5 µm to about 10 µm (e.g., as measured along a major axis). The channel size can be 1 mm height by 1 mm deep as above, or can be about 70 μm to about 100 μm height, and about 70 μm to about 100 μm deep, with a 20 μm to 500 μm spacing between the channels.

Figure 8:
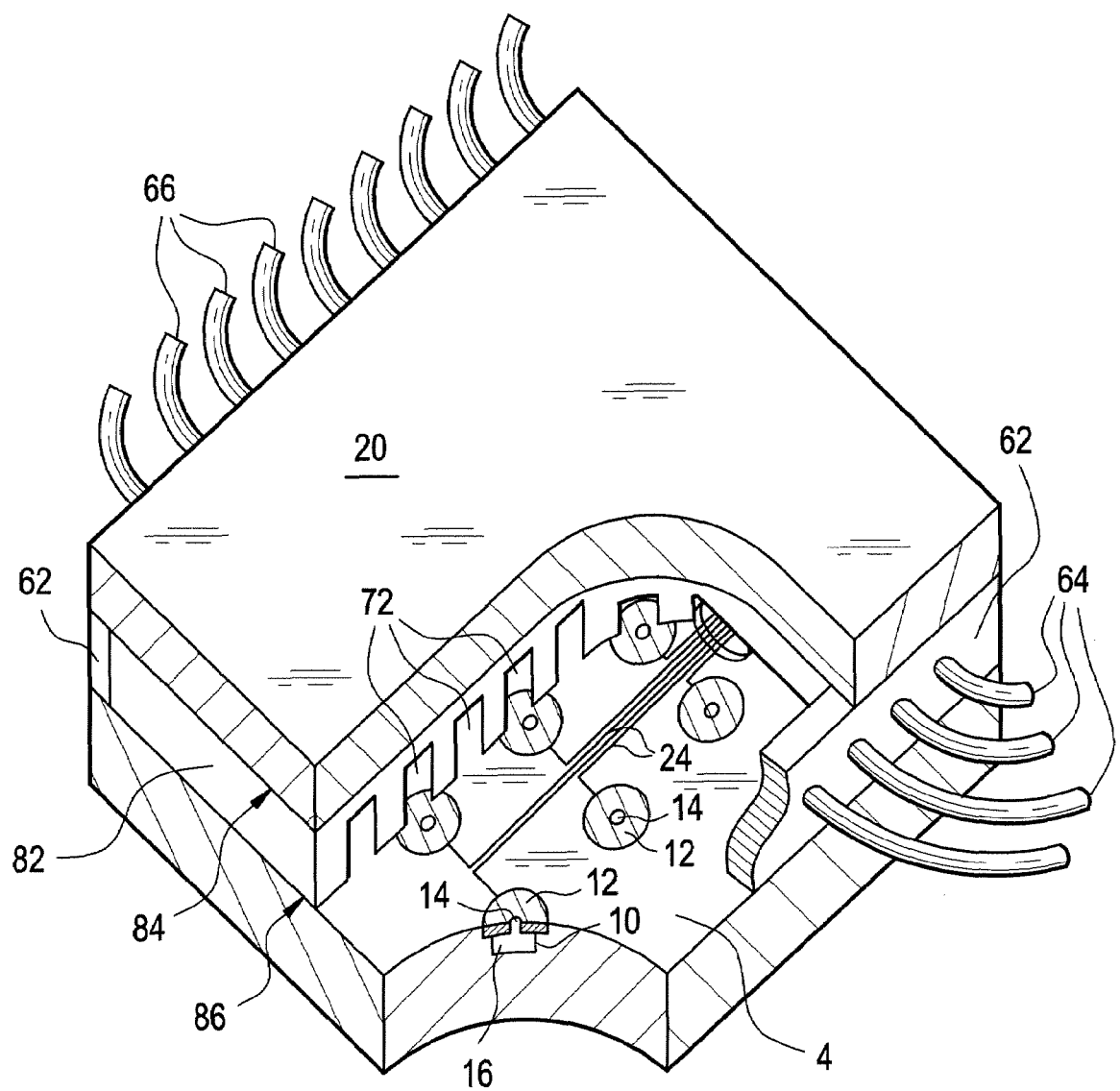
FIG. 8 is a partially cross-sectioned view of an exemplary cooling system.

Referring now to FIG. 8, a partially cross-sectioned view of an exemplary cooling system 80 is illustrated. The cooling system 80 comprises a substrate 4 having sixteen fluidic jets disposed therein (one fluidic jet is shown in cross-section). The fluidic jets comprise membranes 12 that are disposed in wells 10 in the substrate 2. A cavity 16 is formed between the membranes 12 and the wells 10. The membranes 12 comprise an orifice 14 that enables fluid communication between the cavity 16 and the cooling channel 72, wherein the size of the orifice (e.g., the orifice diameter or orifice width) is less than the channel width.

The cooling channels 72 are formed within a heat sink plate 82 having an upper surface 84 and a lower surface 86. The lower surface 86 is connected to the substrate 4, and walls 62 are disposed on the heat sink plate 82 such that fluid communicate is restricted between the cooling channels 72. The upper surface 84 is connected in thermal communication with an IC 20.

Cooling media 26 is supplied to the cooling system 80 through inlet tubes 64, flows through the cooling channels 72, and absorbs thermal energy from the IC 20. In addition, electrical energy can be supplied to the membranes 12 of the fluidic jets via leads 24, which can activate the fluidic jets to operate, thereby causing turbulent flow within the cooling channels 72, and causing additional heat to be removed from the IC 20. The heated cooling media 26 exits the conduit 18 through outlet tubes 66.

In the present embodiment, the IC 20 comprises a size of about 3 inches (76 mm) in length by about 3 inches (76 mm) in width by about 0.2 inches (5 mm) in thickness, wherein each of the sixteen fluidic jets comprise membranes measuring about 0.75 inches (19 mm) in diameter having a thickness of about 0.03 inches (0.76 mm).

The integrated circuits 20, substrates 4, cooling channels 72, heat sink plates 82, walls 62, and so forth can be attached to one another utilizing thermal grease, mechanical means (e.g., rivets, screws, bolts, and so forth), solder, adhesives (thermally conductive epoxy), and so forth.

The cooling channels 72 can comprise any geometry that is conducive to drawing heat energy from the IC 20, e.g., polygonal and/or rounded, with a generally rectangular geometry generally employed. The channels have a width of about 20 micrometers (μm) to about 2 millimeters (mm), or, more specifically, about 25 μm to about 300 μm. The channel height can be about 25 μm to about 3 mm, or, more specifically, about 50 μm to about 500 μm. The length of the channel is generally equal to about the size of the integrated circuit 20. Optionally, the channels can have a changing size (e.g., width and/or height), such as converging and/or diverging sides, e.g., to attain a desired flow characteristic. The specific dimensions of the cooling channels 72 can be tailored based on the amount of heat to be removed and the permissible dimensions in the particular embodiment. In one exemplary embodiment, cooling channels 72 comprising a rectangular cross-section comprises a channel height of about 250 micrometers (μm), a channel width of about 100 μm, and a length of about 2.0 centimeters.

Various materials can be employed for the cooling channels 72, which aid in removing heat energy from the IC 20. Exemplary materials comprise ceramics (e.g., silicon oxides, aluminum oxides, zirconium oxides, silicon carbide, sodium carbide, zinc oxide, and so forth), metals (e.g., iron, aluminum, copper, or nickel), metal alloys (e.g., nickel-cobalt alloys, boron-nitride, silicon-carbide, as well as martensitic, ferritic, and austenitic materials), polymeric materials (e.g., polysulfone, polyetherimide and so forth), semiconductors (e.g., germanium, silicon, gallium arsenide, indium phosphide, and mercury cadmium telluride), as well as combinations comprising at least one of the foregoing materials. It is also desirable that the cooling channels 72 can withstand dimensional changes caused by varying temperatures, vibration, impact, and so forth.

The cooling channels 72 can be formed into the IC 20 or disposed thereon (e.g., heat sink plate 72). In embodiments wherein the cooling channels 72 are formed into the IC 20, material removal processes, such as milling, grinding, drilling, boring, etching, eroding, and so forth, can be employed. In addition, the cooling channels 72 can be formed as the IC 20 is formed, such as utilizing casting, molding, deposition, or other forming processes. In one exemplary process, a computer controlled neodymium-doped yttrium aluminum garnet laser can be employed for the sublimation of surface of an IC 20 to form cooling channels 72 therein. In another exemplary process, a silicon mask comprising rectangular shaped voids is attached to an IC 20. Once attached, a deposition process (e.g., physical vapor deposition and/or chemical vapor deposition) is employed to build the cooling channels 72 on the surface of the IC 20. Alternatively, cooling channels 72 can be achieved by etching (e.g., dry or wet) over the substrate, such as using silicon. In embodiments wherein a heat sink plate 82 is employed, the cooling channels 72 can be formed therein utilizing any of the methods discussed above. Once formed, the heat sink plate 82 can be attached to the IC utilizing thermal grease, mechanical means (e.g., rivets, screws, bolts, and so forth), solder, adhesives (thermally conductive epoxy), and so forth.

The cooling system discussed above can also be configured in alternative embodiment comprising various cooling systems (2, 40, 60, 70, 80) assembled in operational communication with each other. For example, configurations having multiple layers can be constructed, wherein more than one cooling system (2, 40, 60, 70, 80) can be stacked on one another. In another embodiment, various cooling systems (2, 40, 60, 70, 80) can be connected in a serial relationship.

The cooling systems (2, 40, 60, 70, 80) disclosed herein offer improved cooling of various components on a milli and micro scale due to the incorporation of fluidic jets. In addition, fluidic jets can be configured with cooling channels to yet even further increase the systems cooling ability.

The present cooling system also enables local control of cooling, even in a system comprising multiple fluidic jets. With the incorporation of a controller and a sensor(s) (e.g., a sensor grid), the controller can also monitor for hot spots on the IC, determine if a fluidic jet is to be activated, and activate a fluidic jet to cool the hot spot. In other words, the fluidic jets can optionally be operated independently such that some fluidic jets are active while others are inactive, thereby enabling the efficient elimination of hot spots and/or control of the temperature of the circuit.

The cooling system can be formed integral with the component to be cooled (e.g., in a single formation step using microfabrication technology), or can be formed in separate steps and attached together using various methods.

The systems disclosed herein can be configured in alternative configurations as well, which provide manufacturers and/or electronic designers to reduce overall IC size by stacking (e.g., layering) cooling ICs, a design currently avoided due to the excessive temperatures generated within the circuit.

Unless defined otherwise, technical and scientific terms used herein have the same meaning as is commonly understood by one of skill in the art to which this invention belongs.

Reference throughout the specification to "one embodiment", "another embodiment", "an embodiment", and so forth, means that a particular element (e.g., feature, structure, and/or characteristic) described in connection with the embodiment is included in at least one embodiment of the present invention. Thus, the element(s) are not necessarily all referring to the same embodiment, and particular elements may be combined in any suitable manner in the various embodiments. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.). The modifier "about" used in connection with a quantity is inclusive of the stated value and has the meaning dictated by the context (e.g., includes the degree of error associated with measurement of the particular quantity). As used herein "Group IA" refers to the groups of the Periodic Table of Elements unless specifically specified otherwise. The suffix "(s)" as used herein is intended to include both the singular and the plural of the term that it modifies, thereby including one or more of that term (e.g., the colorant(s) includes one or more colorants). Furthermore, as used herein, "combination" is inclusive of blends, mixtures, alloys, reaction products, and the like.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A cooling system comprising:
   a cooling channel for receiving a cooling media,
   the cooling channel being for thermal communication with a component to be cooled,
   wherein the cooling channel has a height of less than or equal to about 3 mm and a width of less than or equal to 2 mm;
   a substrate disposed near the cooling channel; and
   a fluidic jet device disposed within the substrate and in fluid communication with the cooling channel, wherein the fluidic jet comprises a cavity defined by a well and a membrane comprising an orifice, wherein the membrane is deformable into the well to draw the cooling media into the cavity via the orifice and away from the well to expel the cooling media from the cavity via the orifice.

2. The cooling system of claim 1, wherein the cooling channel has a channel width that is about 25 μm to about 300 μm and a channel height that is about 50 μm to about 500 μm.

3. The cooling system of claim 1, wherein the membrane has a membrane size, wherein the orifice disposed through the membrane forms the fluid communication between the fluidic jet device and the channel, and wherein the orifice has an orifice size that is less than or equal to about 50% of the membrane size.

4. The cooling system of claim 3, wherein the orifice size that is less than or equal to about 25% of the membrane size.

5. The cooling system of claim 4, wherein the orifice size that is about 8% to about 15% of the membrane size.

6. The cooling system of claim 1, wherein the membrane is connected in operable communication to a lead for supplying electrical energy to the membrane to cause the membrane to oscillate.

7. The cooling system of claim 1, further comprising a sensor that is connected in operational communication to a controller for activating the fluidic jet device.

8. The cooling system of claim 1, further comprising
   a plurality of the fluidic jets, and
   a sensor connected to each fluidic jet and connected in operational communication to a controller for activating the fluidic jets individually.

9. The cooling system of claim 1, wherein the channel has a changing width and/or height.

10. The cooling system of claim 1, wherein the cooling system is a closed loop system comprising a plurality of the fluidic jets, a plurality of the channels, and a cooling media in the cooling channels.

11. The cooling system of claim 1, wherein the cooling channels are in thermal communication with an electronic component.

12. The cooling system of claim 11, wherein the electronic component is an integrated circuit.

13. The cooling system of claim 1, wherein the cavity has a cavity depth of about 10 μm to about 3 mm.

* * * * *